(12) United States Patent
Roh

(10) Patent No.: US 12,173,400 B2
(45) Date of Patent: Dec. 24, 2024

(54) SUBSTRATE PROCESSING DEVICE

(71) Applicant: ASM IP Holding B.V., Almere (NL)

(72) Inventor: JaeMin Roh, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/239,856

(22) Filed: Aug. 30, 2023

(65) Prior Publication Data

US 2023/0399740 A1     Dec. 14, 2023

Related U.S. Application Data

(63) Continuation of application No. 17/330,999, filed on May 26, 2021, now Pat. No. 11,767,589.

(60) Provisional application No. 63/032,456, filed on May 29, 2020.

(51) Int. Cl.
  *H01J 37/32*     (2006.01)
  *C23C 16/44*     (2006.01)
  *H01L 21/67*     (2006.01)

(52) U.S. Cl.
  CPC ..... *C23C 16/4412* (2013.01); *H01J 37/32834* (2013.01); *H01J 2237/3323* (2013.01); *H01L 21/67017* (2013.01)

(58) Field of Classification Search
  CPC ........... H01J 37/32834; H01J 37/32715; H01J 37/32513; H01J 37/32449; H01J 2237/332; H01J 37/32431; H01J 37/3244; H01L 21/67017; H01L 21/67207; H01L 21/67092; H01L 21/67389; C23C 16/4412; C23C 16/50; C23C 16/4585; C23C 16/54; B08B 17/025

USPC ........................ 118/719; 156/345.31, 345.32
See application file for complete search history.

(56) References Cited

U.S. PATENT DOCUMENTS

| | | | |
|---|---|---|---|
| 6,261,408 B1 | 7/2001 | Schneider et al. | |
| 11,171,025 B2* | 11/2021 | Jeong | H01L 21/67017 |
| 11,401,605 B2* | 8/2022 | Roh | C23C 16/45508 |
| 11,430,640 B2* | 8/2022 | Jeong | C23C 16/50 |
| 11,443,926 B2* | 9/2022 | Jeong | C23C 16/4412 |
| 11,646,184 B2* | 5/2023 | Moon | H01J 37/32834 |
| | | | 118/715 |
| 11,767,589 B2* | 9/2023 | Roh | C23C 16/4585 |
| | | | 118/715 |
| 11,823,876 B2* | 11/2023 | Lee | H01J 37/32834 |
| 11,923,181 B2* | 3/2024 | Moon | H01J 37/32449 |
| 2009/0084317 A1 | 4/2009 | Wu et al. | |
| 2016/0237559 A1 | 8/2016 | Tsuji | |

(Continued)

FOREIGN PATENT DOCUMENTS

TW    201715072 A    5/2017

*Primary Examiner* — Rudy Zervigon
(74) *Attorney, Agent, or Firm* — Snell & Wilmer L.L.P.

(57) ABSTRACT

A substrate processing device with improved exhaust efficiency and process reproducibility includes: a plurality of reactors; a plurality of exhaust ports in communication with the plurality of reactors and symmetrically arranged with respect to the reactors, respectively; and a plurality of exhaust channels in communication with the plurality of exhaust ports, wherein each exhaust channel includes a plurality of exhaust channels including a first channel extending in the first direction and a second channel extending in a second direction different from the first direction, wherein the plurality of exhaust channels extend through components supporting at least a portion of the plurality of reactors.

14 Claims, 13 Drawing Sheets

(56) References Cited

U.S. PATENT DOCUMENTS

2016/0284574 A1     9/2016   Smargiassi et al.
2019/0385873 A1*   12/2019   Yamagishi ........ H01L 21/67739
2020/0378402 A1*   12/2020   Mustafa .............. F04D 29/4286

* cited by examiner

SUBSTRATE PROCESSING DEVICE

CROSS-REFERENCE TO RELATED APPLICATIONS

This application is a continuation of, and claims priority to, U.S. patent application Ser. No. 17/330,999 filed May 26, 2021 titled SUBSTRATE PROCESSING DEVICE, which claims the benefit of and priority to U.S. Provisional Application No. 63/032,456, filed on May 29, 2020 in the United States Patent and Trademark Office, the disclosures of which are incorporated herein in their entirety by reference.

BACKGROUND

1. Field

One or more embodiments relate to a substrate processing device, and more particularly, to a substrate processing device having an improved exhaust structure of a batch type reactor.

2. Description of the Related Art

Multi-reactor chambers have advantages of high hourly productivity and precise control of individual substrates. However, on the other hand, the multi-reactor chambers have a problem that is difficult to implement a symmetry of thickness uniformity of a thin film deposited on a substrate. For example, as the size of a semiconductor device becomes smaller, deposition of thin films with concentric film profile on a substrate is required for compatibility with subsequent processes.

SUMMARY

One or more embodiments include a substrate processing device capable of improving deviation of an exhaust flow to achieve good thickness uniformity of a thin film.

One or more embodiments include a substrate processing device that may further simplify an external structure of a chamber by forming an exhaust channel of a reactor in a chamber lid and a chamber wall, and that may make it lighter and easier to maintain.

Additional aspects will be set forth in part in the description which follows and, in part, will be apparent from the description, or may be learned by practice of the presented embodiments of the disclosure.

According to one or more embodiments, a substrate processing device includes a reactor, a support portion configured to support at least a portion of the reactor, and a first exhaust channel and a second exhaust channel in communication with a reaction space of the reactor, wherein each of the first exhaust channel and the second exhaust channel may extend to surround a portion of the reaction space.

According to an example of the substrate processing device, the first exhaust channel may extend through a first portion of the support portion.

According to another example of the substrate processing device, the substrate processing device may further include an exhaust space surrounding the reaction space, and a first exhaust port between the exhaust space and the first exhaust channel.

According to another example of the substrate processing device, the substrate processing device may further include a first sealing member between the first exhaust port and the support portion.

According to another example of the substrate processing device, the substrate processing device may further include a first channel lid arranged between the first exhaust port and the support portion, and the first exhaust channel may extend between the first channel lid and the support portion.

According to another example of the substrate processing device, the substrate processing device may further include a second sealing member between the first exhaust port and the first channel lid.

According to another example of the substrate processing device, the second exhaust channel may extend through a second portion of the support portion different from the first portion.

According to another example of the substrate processing device, the support portion may further include a joining point of the first exhaust channel and the second exhaust channel.

According to another example of the substrate processing device, the joining point may be arranged at the corner of the support portion.

According to another example of the substrate processing device, the joining point may include a T-shaped or T-like shaped channel structure.

According to another example of the substrate processing device, the substrate processing device may include a partition below the support portion, and a transfer channel in communication with the first exhaust channel and the second exhaust channel, wherein the transfer channel may extend through a portion of the partition.

According to another example of the substrate processing device, the substrate processing device may further include a second channel lid arranged between the support portion and the partition.

According to another example of the substrate processing device, the transfer channel may extend between the second channel lid and the partition.

According to another example of the substrate processing device, a diameter of the first exhaust channel may be ½ of a diameter of the transfer channel.

According to one or more embodiments, a substrate processing device includes a first reactor, a second reactor, a support configured to support at least a portion of the first reactor and at least a portion of the second reactor, a first exhaust channel in communication with a first reaction space of the first reactor, a second exhaust channel in communication with the first reaction space, a third exhaust channel in communication with a second reaction space of the second reactor, and a fourth exhaust channel in communication with the second reaction space, wherein each of the first exhaust channel and the second exhaust channel may extend to surround at least a portion of the first reaction space, and each of the third exhaust channel and the fourth exhaust channel may extend to surround at least a portion of the second reaction space.

According to an example of the substrate processing device, the first exhaust channel may extend through a first portion of the support portion, the second exhaust channel may extend through a second portion of the support portion, the third exhaust channel may extend through a third portion of the support portion, and the fourth exhaust channel may extend through a fourth portion of the support portion.

According to another example of the substrate processing device, the first exhaust channel and the fourth exhaust channel may extend parallel to each other.

According to another example of the substrate processing device, the second exhaust channel and the third exhaust channel may extend on the same line.

According to another example of the substrate processing device, the first exhaust channel and the second exhaust channel may join at a first corner of the support portion, and the third exhaust channel and the fourth exhaust channel may join at a second corner of the support portion.

According to one or more embodiments, a substrate processing device includes a plurality of reactors, a plurality of exhaust ports in communication with the plurality of reactors and symmetrically arranged with respect to the reactors, respectively, and a plurality of exhaust channels in communication with the plurality of exhaust ports, wherein each exhaust channel includes a plurality of exhaust channels including a first channel extending in a first direction and a second channel extending in a second direction different from the first direction, wherein the plurality of exhaust channels may extend through components supporting at least a portion of the plurality of reactors.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
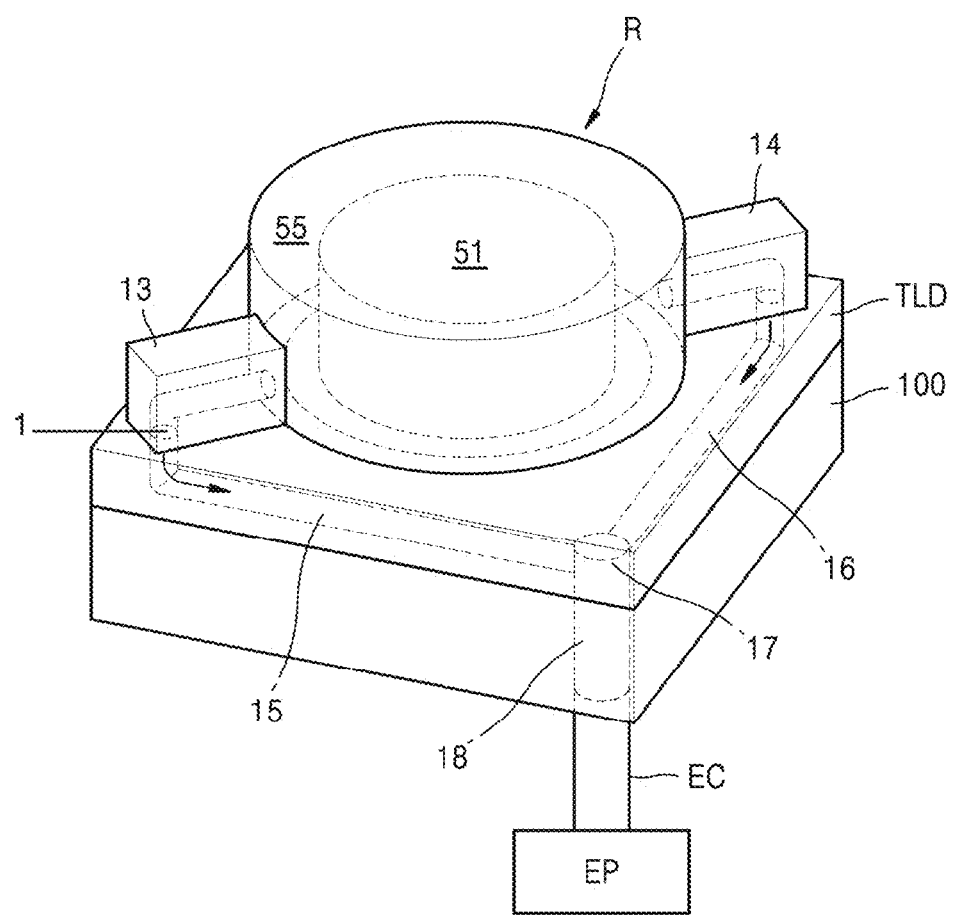
FIG. 1 is a view of a substrate processing device according to embodiments of the inventive concept.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the disclosure will be described in detail with reference to the accompanying drawings.

In this regard, the present embodiments may have different forms and should not be construed as being limited to the descriptions set forth herein. Rather, these embodiments are provided so that the present disclosure will be thorough and complete, and will fully convey the scope of the present disclosure to one of ordinary skill in the art.

The terminology used herein is for the purpose of describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any order, quantity, or importance, but rather are only used to distinguish one component, region, layer, and/or section from another component, region, layer, and/or section. Thus, a first member, component, region, layer, or section discussed below could be termed a second member, component, region, layer, or section without departing from the teachings of embodiments.

Embodiments of the disclosure will be described hereinafter with reference to the drawings in which embodiments of the disclosure are schematically illustrated. In the drawings, variations from the illustrated shapes may be expected as a result of, for example, manufacturing techniques and/or tolerances. Thus, the embodiments of the disclosure should not be construed as being limited to the particular shapes of regions illustrated herein but may include deviations in shapes that result, for example, from manufacturing processes.

FIG. 1 is a schematic view of a substrate processing device according to embodiments of the inventive concept.

Referring to FIG. 1, the substrate processing device may include a reactor R, a partition 100, a support portion TLD, a first exhaust port 13, a second exhaust port 14, a first exhaust channel 15, a second exhaust channel 16, a transfer channel 18, an external channel EC, and an exhaust pump EP.

The reactor R may be a space in which processing is performed on an object to be processed such as a substrate. Although only one reactor is shown in FIG. 1, a plurality of reactors may be implemented. The reactor may provide a space for performing heating, deposition, etching, polishing, ion implantation, and/or other processing on the object to be processed. The reactor may be an open reactor in which a reaction space is kept open, or a closed reactor in which the reaction space is kept closed.

For example, the reactor R may be configured to perform a moving function, a vacuum sealing function, a heating function, an exhaust function, and/or other functions for the object to be processed such that the object is processed in the reactor. For example, the reactor may include a reaction space 51 for processing an object to be processed such as a substrate, and an exhaust space 55 for exhausting gas of the reaction space 51.

In an alternative embodiment, the exhaust space 55 may extend to surround the reaction space 51. In another alternative embodiment, the reactor may include at least one lid structure, and the exhaust space 55 and/or the reaction space 51 may be formed through the lid structure. In another alternative embodiment, the reactor may include a first lid and a second lid. In this case, the exhaust space 55 may be formed in the first lid and a processing unit (e.g., a gas supply unit) for reaction may be formed in the second lid (see FIG. 4).

The partition 100 is a chamber accommodating the reactor R, and may also be referred to as a chamber body. In an embodiment, the reactor R including the reaction space 51 is referred to as an inner chamber, and the entire structure of the substrate processing device accommodating a plurality of reactors R may be referred to as an outer chamber. It should be noted that, in this specification, the expression that a reactor is accommodated in a partition is a concept that includes any configurations in which the reactor is surrounded by the partition, the reactor is seated on a structure defined by the partition, or the reactor is supported by the partition.

The support portion TLD may be configured to support at least a portion of the reactor R. For example, the reactor R may include an exhaust unit configured to provide the exhaust space 55 surrounding the reaction space 51, and the support portion TLD may be configured to support the exhaust unit. The support portion TLD may be supported by the partition 100. As described above, the support portion TLD may serve as a top lid which is supported by the partition 100 to cover the outer chamber while supporting the reactor R.

The first exhaust port 13 may be configured to be in communication with the exhaust space 55. In an embodiment, the first exhaust port 13 may be configured to be in communication with a first portion of the exhaust space 55 formed to surround the reaction space 51. The first exhaust port 13 may connect one end of the first exhaust channel 15 with the exhaust space 55. In an alternative embodiment, gas in the exhaust space 55 may be exhausted downward to the first exhaust channel 15 through the first exhaust port 13. This downward exhaust may be achieved through a channel structure inside the first exhaust port 13. For example, a portion of the channel structure of the first exhaust port 13 may be in communication with the exhaust space 55 in a side direction, and another portion of the channel structure of the first exhaust port 13 may be in communication with the first exhaust channel 15 in a downward direction.

The second exhaust port 14 may be configured to be in communication with the exhaust space 55. In an embodiment, the second exhaust port 14 may be configured to be in communication with a second portion of the exhaust space 55 formed to surround the reaction space 51. The second exhaust port 14 may connect one end of the second exhaust path 16 with the exhaust space 55. In an alternative embodiment, gas in the exhaust space 55 may be exhausted downward to the second exhaust channel 16 through the second exhaust port 14. This downward exhaust may be achieved through a channel structure inside the second exhaust port 14. For example, a portion of the channel structure of the second exhaust port 14 may be in communication with the exhaust space 55 in a side direction, and another portion of the channel structure of the second exhaust port 14 may be in communication with the second exhaust path 16 in a downward direction.

In an alternative embodiment, the first exhaust port 13 and the second exhaust port 14 may be arranged symmetrically. For example, the first exhaust port 13 and the second exhaust port 14 may be arranged to face opposite directions to each other with an interval of 180 degrees. In another embodiment, in addition to the first exhaust port 13 and the second exhaust port 14, an additional exhaust port may be provided, and these may be arranged at the same angular interval.

In the substrate processing device having such an exhaust structure, a gas flow and an exhaust flow in a reactor may be uniformly controlled by providing a plurality of exhaust ports around the reaction space 51. In an alternative embodiment, the exhaust ports may be arranged asymmetrically for a more efficient and uniform exhaust flow in the reactor. Optimized arrangement of the exhaust ports may be determined empirically or by simulation evaluation.

The first exhaust channel 15 may connect the first exhaust port 13 and the transfer channel 18. One end of the first exhaust channel 15 may be connected to the first exhaust port 13 and the other end of the first exhaust channel 15 may be connected to the first transfer channel 18. Therefore, a portion of gas in the reaction space 51 may be exhausted by flowing to the transfer channel 18 through the first exhaust port 13, the first exhaust channel 15, and a joining point 17.

In some embodiments, the first exhaust channel 15 may extend to surround a portion of the exhaust space 55. Because the first exhaust port 13 has a channel structure for downward exhaust, the first exhaust channel 15 may be below the exhaust space 55 of the reactor R. For example, the first exhaust channel 15 may extend below the exhaust space 55 along an edge of the support portion TLD. A distance from the center of symmetry of the exhaust space 55 surrounding the reaction space 51 to the first exhaust channel 15 may be greater than a distance from the center of symmetry of the exhaust space 55 to an edge of the exhaust space 55. Accordingly, the first exhaust channel 15 surrounding a portion of the exhaust space 55 may be formed.

The first exhaust channel 15 may extend through a first portion of the support portion TLD. Because gas flowing through the first exhaust channel 15 is transferred from the first exhaust port 13 to the support portion TLD, a first sealing member 1 may be arranged between the first exhaust port 13 and the support portion TLD to prevent such gas leakage. The first sealing member 1 may be arranged in a groove provided in the first exhaust port 13 and/or the support portion TLD.

In an alternative embodiment, a first channel lid may be arranged between the first exhaust port 13 and the support portion TLD. Although the first channel lid and the support portion TLD are illustrated in FIG. 1 in an integrated configuration, the first channel lid may be implemented in a separate configuration from the support portion TLD (see a first lid 130 of FIG. 12). In this case, the first exhaust channel 15 may extend between the first channel lid and the support portion TLD. That is, the first channel lid may extend in an extending direction of the first exhaust channel 15.

By implementing the first channel lid and the support portion TLD in separate configurations, smooth maintenance of the first exhaust channel 15 may be achieved. For example, the first channel lid implemented in a separate configuration from the support portion TLD may be fixed to the support portion TLD through a separate coupling member, and by removing the coupling member, the first channel lid may be separated and the first exhaust channel 15 may be exposed accordingly. In a further embodiment, to prevent gas leakage, a second sealing member 2 may be arranged between the first exhaust port 13 and the first channel lid. First and second channel lids are sometimes referred to herein simply as first lid and second lid.

The second exhaust channel 16 may connect the second exhaust port 14 and the transfer channel 18. One end of the second exhaust channel 16 may be connected to the second exhaust port 14 and the other end of the second exhaust channel 16 may be connected to the transfer channel 18. Therefore, another portion of the gas in the reaction space 51 may be exhausted by flowing to the transfer channel 18 through the second exhaust port 14, the second exhaust channel 16, and the joining point 17. The second exhaust channel 16 may extend through a second portion (i.e., a second portion different from the first portion of the support portion TLD) of the support portion TLD.

In some embodiments, the second exhaust channel 16 may extend to surround a portion of the exhaust space 55. Because the second exhaust port 14 has a channel structure for downward exhaust, the second exhaust channel 16 may be below the exhaust space 55 of the reactor R. For example, the second exhaust channel 16 may extend below the exhaust space 55 along the edge of the support portion TLD. A distance from the center of symmetry of the exhaust space 55 surrounding the reaction space 51 to the second exhaust channel 16 may be greater than a distance from the center of the exhaust space 55 to the edge of the exhaust space 55. Accordingly, the second exhaust channel 16 surrounding a portion of the exhaust space 55 may be formed.

At the joining point 17, the first exhaust channel 15 and the second exhaust channel 16 may be connected to each other. That is, gas in the first exhaust channel 15 and gas in the second exhaust channel 16 may be exhausted through the joining point 17. The joining point 17 may be implemented within the support portion TLD. For example, the joining point 17 may be arranged at a corner of the support portion TLD. In more detail, the first exhaust channel 15 may extend along a first surface of the support portion TLD, the second exhaust channel 16 may extend along a second surface of the support portion TLD, and the joining point 17 may be at a corner where the first surface and the second surface meet.

The joining point 17 may be connected to the transfer channel 18, and thus the gas in the first exhaust channel 15 and the gas in the second exhaust channel 16 may be transferred to the exhaust pump EP through the joining point 17 and the transfer channel 18. In an alternative embodiment, the aforementioned exhaust may be downward exhaust, and the downward exhaust may be achieved through a channel structure inside components (e.g., the support portion TLD and/or the partition 100) supporting at least a portion of the reactor R. For example, to implement the channel structure, the first exhaust channel 15 and the second exhaust channel 16 may be extended through the support portion TLD supporting at least a portion of the reactor R.

A channel structure around the joining point 17 may be T-shaped or T-like. A first portion of the channel structure around the joining point 17 may be in communication with the first exhaust channel 15 in a first side direction, a second portion of the channel structure around the joining point 17 may be in communication with the second exhaust channel 16 in a second side direction, and a third portion of the channel structure around the joining point 17 may be in communication with the transfer channel 18 in a downward direction.

In some embodiments, a cross-sectional area of the transfer channel 18 may be greater than a cross-sectional area of the first exhaust channel 15. For example, the cross-sectional area of the transfer channel 18 may be twice the cross-sectional area of the first exhaust channel 15, and the cross-sectional area of the transfer channel 18 may be twice the cross-sectional area of the second exhaust channel 16. Therefore, gas moving through the first exhaust channel 15 and the second exhaust channel 16 may be transferred to the transfer channel 18 without a flow collision or a flow bottleneck or a change in a flow rate. In some embodiments, cross-sections of the first exhaust channel 15 and the transfer channel 18 may both be circular, in which case a diameter of the first exhaust channel 15 may be ½ of a diameter of the transfer channel 18.

As described above, the first exhaust channel 15, the second exhaust channel 16, and their joining point 17 may be arranged to be inserted into the support portion TLD. Such an arrangement structure of the first exhaust channel 15, the second exhaust channel 16, and the joining point 17 has a technical advantage that an exhaust structure may be simplified in a multi-reactor structure in which substrate processing for a plurality of reactors is performed at the same time.

The transfer channel 18 may be provided in the partition 100. The transfer channel 18 may be below the support portion TLD. In some embodiments, the transfer channel 18 may be formed to extend along a portion of the partition 100 (e.g., inside of a sidewall). In an embodiment, the substrate processing device includes a first surface and a second surface adjacent to the first surface, and the transfer channel 18 may extend along an edge between the first surface and the second surface. In additional embodiments, the transfer channel 18 may be formed to extend along the inside of a lower wall of the partition 100.

In an alternative embodiment, a second channel lid may be arranged between the support portion TLD and the partition 100. Although the second channel lid and the partition 100 are illustrated in FIG. 1 in an integrated configuration, the second channel lid may be implemented in a separate configuration from the partition 100.

Although the transfer channel 18 extends vertically in the partition 100 in FIG. 1, in some embodiments, the transfer channel 18 may extend horizontally along a surface of the partition 100. In this case, the transfer channel 18 will be arranged between the second channel lid and the partition 100 (see a second lid 140 in FIG. 12). In addition, the second channel lid may extend in an extension direction (i.e., a horizontal extending direction) of the transfer channel 18.

Figure 2:
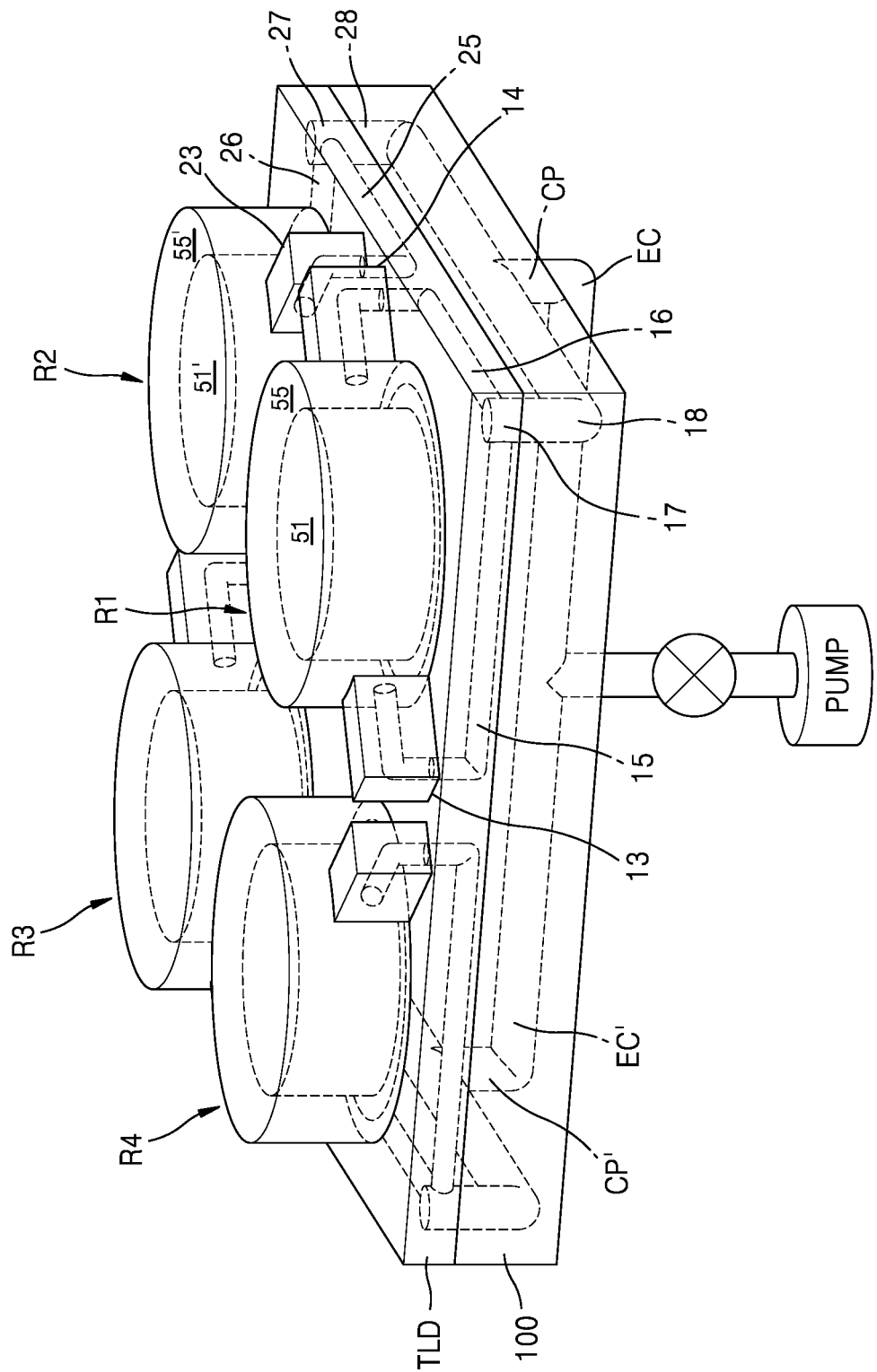
FIG. 2 is a view of a substrate processing device according to other embodiments of the inventive concept.
Figure 3:
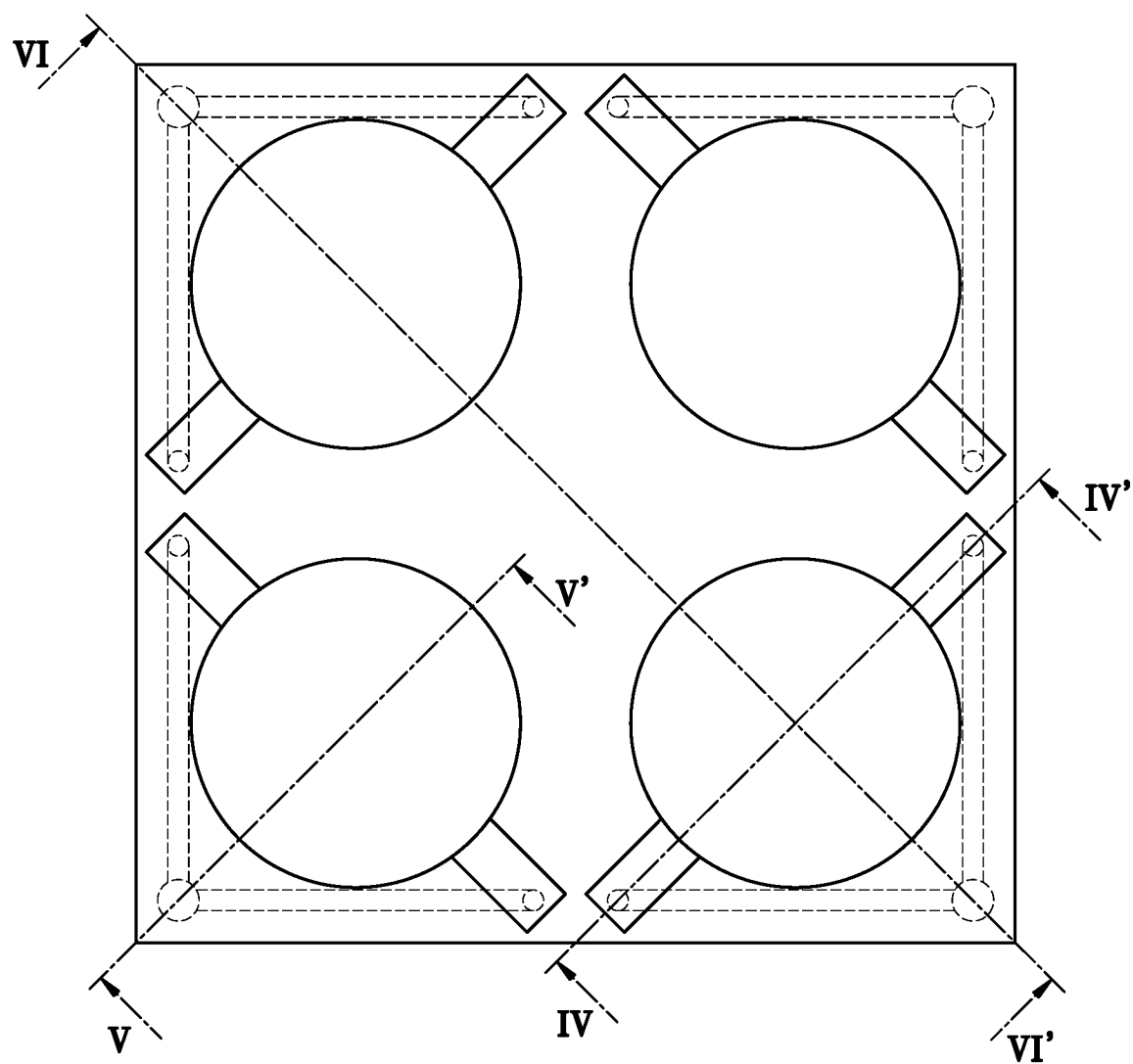
FIG. 3 is a plan view of the substrate processing device of FIG. 2.

FIG. 2 is a view of a substrate processing device according to other embodiments of the inventive concept. FIG. 3 is a plan view of the substrate processing device. The substrate processing device according to these embodiments may be a modification of the substrate processing device according to the above-described embodiments. Hereinafter, repeated descriptions of the embodiments will not be given herein.

The substrate processing device may be a multi-reactor device including a plurality of reactors. That is, a first reactor R1, a second reactor R2, a third reactor R3, and a fourth reactor R4 may be included in one substrate processing device such that a plurality of substrates may be processed simultaneously. Although four reactors are shown in FIGS. 2 and 3, the present disclosure is not limited thereto, and the substrate processing device may include a plurality of reactors (i.e., two or more reactors).

Referring to FIGS. 2 and 3, the substrate processing device may include the first reactor R1, the first exhaust port 13, the second exhaust port 14, the first exhaust channel 15, the second exhaust channel 16, and the first transfer channel 18. These components have been described in detail with reference to FIG. 1, and thus repeated descriptions thereof will not be given herein. In addition, the substrate processing device may further include the second reactor R2, a third exhaust port 23, a fourth exhaust port (not shown), a third exhaust channel 25, a fourth exhaust channel 26, and a second transfer channel 28. The substrate processing device may further include a structure of corresponding exhaust port, exhaust channel, and transfer port associated with the third reactor R3 and the fourth reactor R4.

The third exhaust port 23 may be configured to be in communication with an exhaust space 55'. In an embodiment, the third exhaust port 23 may be configured to be in communication with a third portion of the exhaust space 55' formed to surround a reaction space 51'. The third exhaust port 23 may connect one end of the third exhaust path 25 with the exhaust space 55'. In an alternative embodiment, gas in the exhaust space 55' may be exhausted downward to the third exhaust channel 25 through the third exhaust port 23. This downward exhaust may be achieved through a channel structure inside the third exhaust port 23. For example, a portion of the channel structure of the third exhaust port 23 may be in communication with the exhaust space 55' in a side direction, and another portion of the channel structure of the third exhaust port 23 may be in communication with the third exhaust channel 25 in a downward direction.

The fourth exhaust port (not shown) may be configured to be in communication with the exhaust space 55' in a different direction from that of the third exhaust port 23. In an embodiment, the fourth exhaust port may be configured to be in communication with a fourth portion of the exhaust space 55' formed to surround the reaction space 51'. The fourth exhaust port may connect one end of the fourth exhaust channel 26 with the exhaust space 55'. In an alternative embodiment, gas in the exhaust space 55' may be exhausted downward to the fourth exhaust channel 26 through the fourth exhaust port. This downward exhaust may be achieved through a channel structure inside the fourth exhaust port. For example, a portion of the channel structure of the fourth exhaust port may be in communication with the exhaust space 55' in a side direction, and another portion of the channel structure of the fourth exhaust port may be in communication with the fourth exhaust channel 26 in a downward direction.

In an alternative embodiment, the third exhaust port 23 and the fourth exhaust port (not shown) may be arranged symmetrically. For example, the third exhaust port 23 and the fourth exhaust port may be arranged to face opposite directions to each other with an interval of 180 degrees. In another embodiment, in addition to the third exhaust port 23 and the fourth exhaust port, an additional exhaust port may be provided, and these may be arranged at the same angular interval. In another embodiment, the third exhaust port 23 and the fourth exhaust port may be arranged asymmetrically and have different angular intervals.

The third exhaust channel 25 may connect the third exhaust port 23 and the second transfer channel 28. One end of the third exhaust channel 25 may be connected to the third exhaust port 23 and the other end of the third exhaust channel 25 may be connected to the second transfer channel 28. Therefore, a portion of gas in the reaction space 51' may be exhausted by flowing to the second transfer channel 28 through the third exhaust port 23, the third exhaust channel 25, and a second joining point 27. The third exhaust channel 25 may extend through a third portion of the support portion TLD.

In some embodiments, the third exhaust channel 25 may extend to surround a portion of the exhaust space 55'. Because the third exhaust port 23 has a channel structure for downward exhaust, the third exhaust channel 25 may be below the exhaust space 55' of the reactor R. For example, the third exhaust channel 25 may extend below the exhaust space 55' along the edge of the support portion TLD. A distance from the center of symmetry of the exhaust space 55' surrounding the reaction space 51' to the third exhaust channel 25 may be greater than a distance from the center of symmetry of the exhaust space 55' to an edge of the exhaust space 55'. Accordingly, the third exhaust channel 25 surrounding a portion of the exhaust space 55' may be formed.

The fourth exhaust channel 26 may connect the fourth exhaust port (not shown) and the second transfer channel 28. One end of the fourth exhaust channel 26 may be connected to the fourth exhaust port and the other end of the fourth exhaust channel 26 may be connected to the second transfer channel 28. Therefore, another portion of the gas in the reaction space 51' may be exhausted by flowing to the second transfer channel 28 through the fourth exhaust port, the fourth exhaust channel 26, and the second joining point 27. The fourth exhaust channel 26 may extend through a fourth portion (i.e., a fourth portion different from the third portion of the support portion TLD) of the support portion TLD.

In some embodiments, the fourth exhaust channel 26 may extend to surround a portion of the exhaust space 55'. Because the fourth exhaust port has a channel structure for downward exhaust, the fourth exhaust channel 26 may be below the exhaust space 55' of the reactor R. For example, the fourth exhaust channel 26 may extend below the exhaust space 55' along an edge of the support portion TLD. A distance from the center of symmetry of the exhaust space 55' surrounding the reaction space 51' to the fourth exhaust channel 26 may be greater than a distance from the center of symmetry of the exhaust space 55' to an edge of the exhaust space 55'. Accordingly, the fourth exhaust channel 26 surrounding a portion of the exhaust space 55' may be formed.

At the second joining point 27, the third exhaust channel 25 and the fourth exhaust channel 26 may be connected to each other. That is, gas in the third exhaust channel 25 and gas in the fourth exhaust channel 26 may be exhausted through the second joining point 27. The second joining point 27 may be implemented within the support portion TLD. For example, the second joining point 27 may be arranged at a second corner of the support portion TLD. In more detail, the third exhaust channel 25 may extend along a third surface of the support portion TLD, the fourth exhaust channel 26 may extend along a fourth surface of the support portion TLD, and the second joining point 27 may be at a second corner where the third surface and the fourth surface meet. Therefore, the first exhaust channel 15 and the second exhaust channel 16 may join at the first joining point 17, which is a first corner of the support portion TLD, and the third exhaust channel 25 and the fourth exhaust channel 26 may join at the second joining point 27, which is the second corner of the support portion TLD.

In an alternative embodiment, the first exhaust channel 15 and the fourth exhaust channel 26 may extend parallel to each other. In other alternative embodiments, the second exhaust channel 16 and the third exhaust channel 25 may extend on the same line.

The second joining point 27 may be connected to the second transfer channel 28, and thus the gas in the third exhaust channel 25 and the gas in the fourth exhaust channel 26 may be transferred to the exhaust pump EP through the second joining point 27 and the second transfer channel 28.

A channel structure around the second joining point 27 may be T-shaped or T-like. A first portion of the channel structure around the second joining point 27 may be in communication with the third exhaust channel 25 in the first side direction, a second portion of the channel structure around the second joining point 27 may be in communication with the fourth exhaust channel 26 in the second side direction, and a third portion of the channel structure around the second joining point 27 may be in communication with the second transfer channel 28 in a downward direction.

The second transfer channel 28 may be provided in the partition 100. The second transfer channel 28 may be below the support portion TLD. In some embodiments, the second transfer channel 28 may be formed to extend along a portion of the partition 100 (e.g., inside of a sidewall).

The substrate processing device may be a multi-substrate processing device implementing a gas supply and an exhaust structure for simultaneous processing of a plurality of substrates. For example, the multi-substrate processing device may be a horizontal batch type device capable of simultaneously processing a plurality of substrates. That is, a plurality of substrates arranged in the transverse direction may be processed simultaneously. In this case, the first reactor R1 and the second reactor R2 may function as an inner chamber for simultaneously processing a plurality of substrates.

The substrate processing device may further include the first transfer channel 18 and the second transfer channel 28. The first transfer channel 18 may connect the first joining point 17 with a connection port CP to transfer gas of the first joining point 17 to the connection port CP. The second transfer channel 28 may connect the second joining point 27 with the connection port CP to transfer gas of the second joining point 27 to the connection port CP. The connection port CP may be connected to the exhaust pump EP through the external channel EC, and the above-described gases may be exhausted to the outside by the exhaust pump EP. In an alternative embodiment, the connection port CP may be arranged inside or outside the partition 100. In another alternative embodiment, the external channel EC may be arranged to be inserted into the partition 100.

In an alternative embodiment, connection ports CP and CP' may be symmetrically arranged with respect to the substrate processing device. For example, as shown in FIGS. 2 and 3, the first connection port CP connected to the first transfer channel 18 and the second transfer channel 28 and the second connection port CP' connected to a third transfer channel and a fourth transfer channel may be symmetrically arranged with respect to a central portion of the substrate processing device.

In some embodiments, external channels EC and EC' may be symmetrically arranged with respect to the substrate processing device. For example, as shown in FIGS. 2 and 3, the first external channel EC and the second external channel EC' respectively connected to the first connection port CP and the second connection port CP' may be symmetrically arranged with respect to the center portion of the substrate processing device. Furthermore, in an alternative embodiment, the exhaust pump EP may be arranged at the center portion of the substrate processing device.

Figure 7:
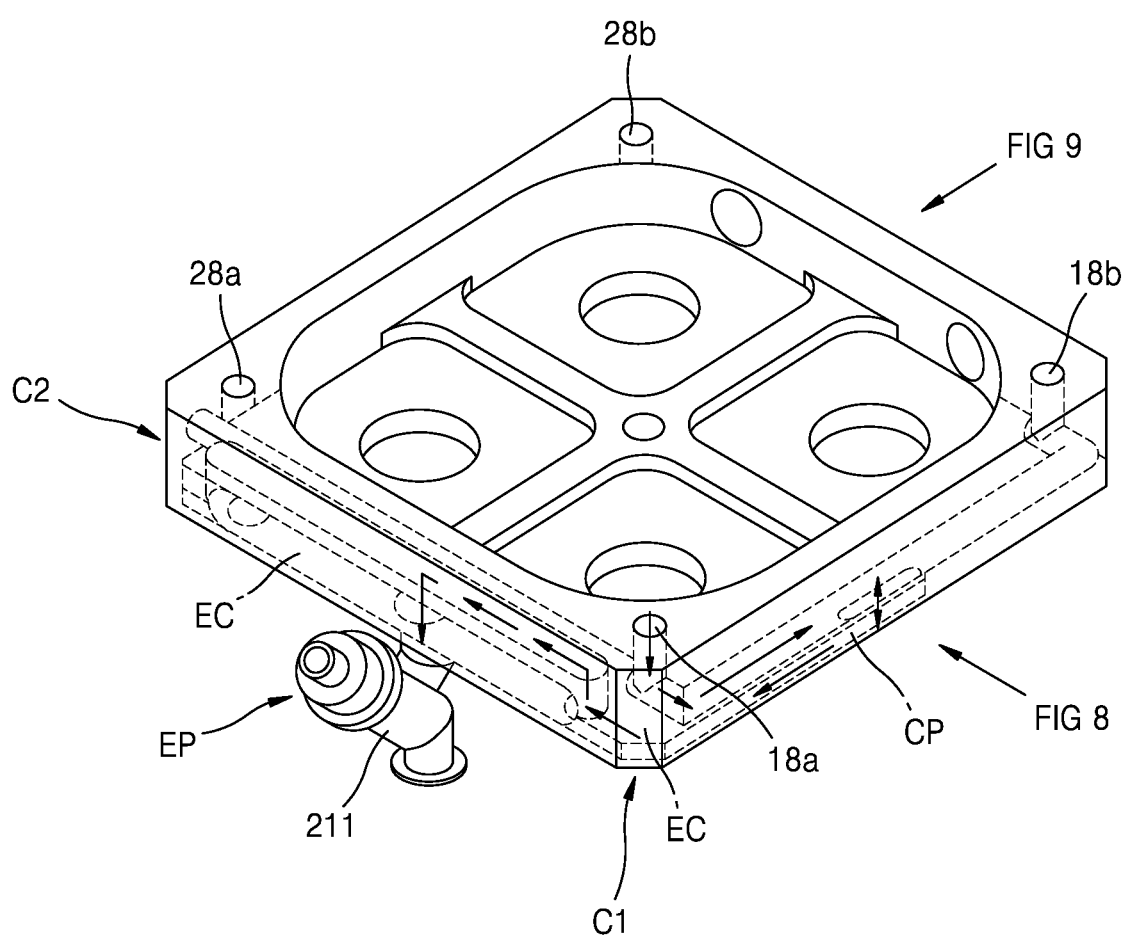
FIG. 7 is a view of a substrate processing device according to some embodiments of the inventive concept.
Figure 8:
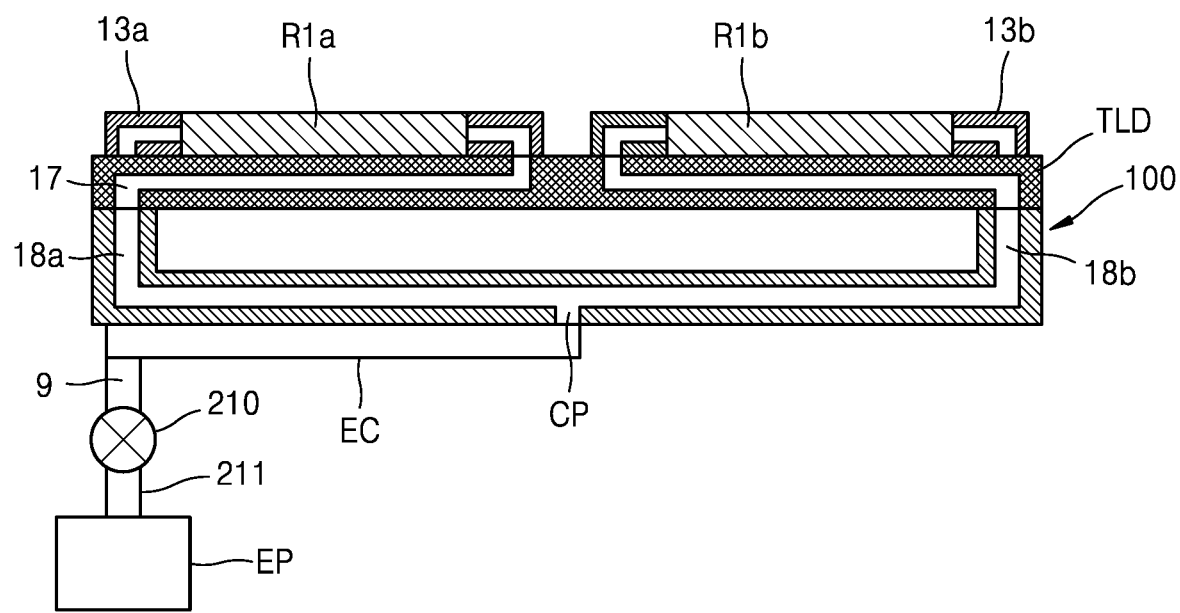
FIG. 8 is a view of FIG. 7 viewed from a first direction.
Figure 9:
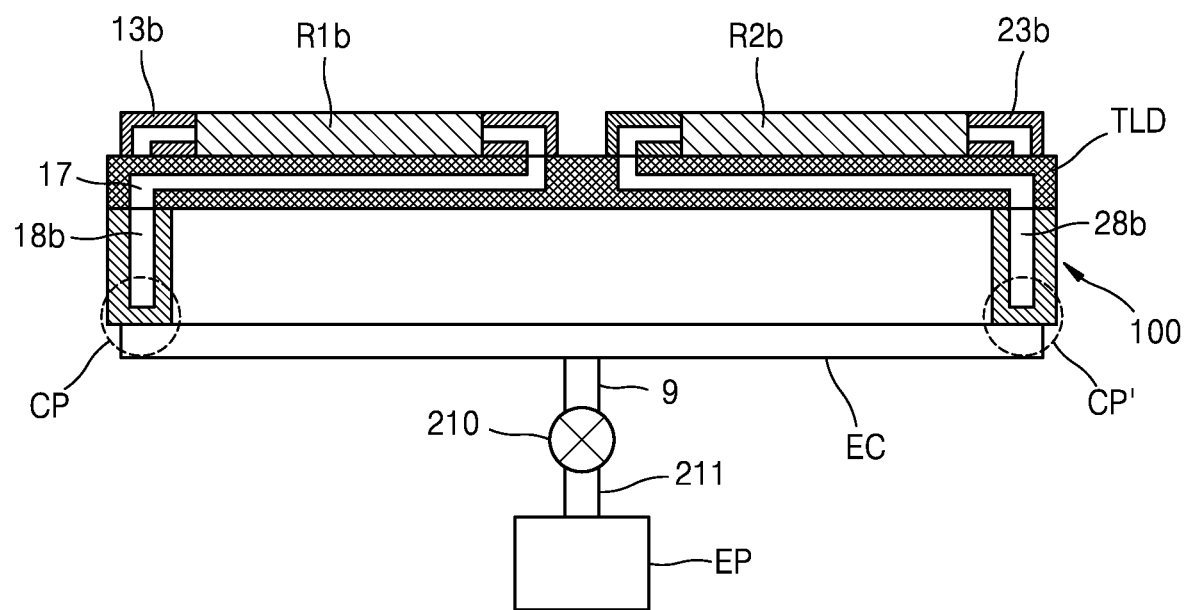
FIG. 9 is a view of FIG. 7 viewed from a second direction.

In another embodiment, the external channel EC and the exhaust pump EP may be arranged asymmetrically with respect to the substrate processing device. For example, as shown in FIGS. 7 to 9, the first external channel EC connected to the first connection port CP may extend below the partition 100 toward a first corner C1 of the outer chamber. In addition, the second external channel EC' connected to the second connection port CP' may extend below the partition 100 toward a second corner C2 of the outer chamber. The exhaust pump EP may be arranged on one surface of the substrate processing device, for example, corresponding to the center between the first corner C1 and the second corner C2. The first external channel EC may extend from a portion extending to the first corner C1 to the exhaust pump EP. Also, the second external channel EC' may extend from a portion extending to the second corner C2 to the exhaust pump EP.

In another alternative embodiment, the first transfer channel 18 and the second transfer channel 28 may be arranged to be inserted into the partition 100 of the outer chamber. For example, the first transfer channel 18 may be formed in the partition 100 of the outer chamber, and the first joining point 17 may be connected to the first transfer channel 18 arranged at the first corner C1 (of FIG. 7) of the partition 100. Similarly, the second transfer channel 28 may be formed in the partition 100 of the outer chamber, and the second joining point 27 may be connected to the second transfer channel 28 arranged at the second corner C2 (of FIG. 7) of the partition 100. The first transfer channel 18 and the second transfer channel 28 may be connected to the connection port CP.

Figure 4:
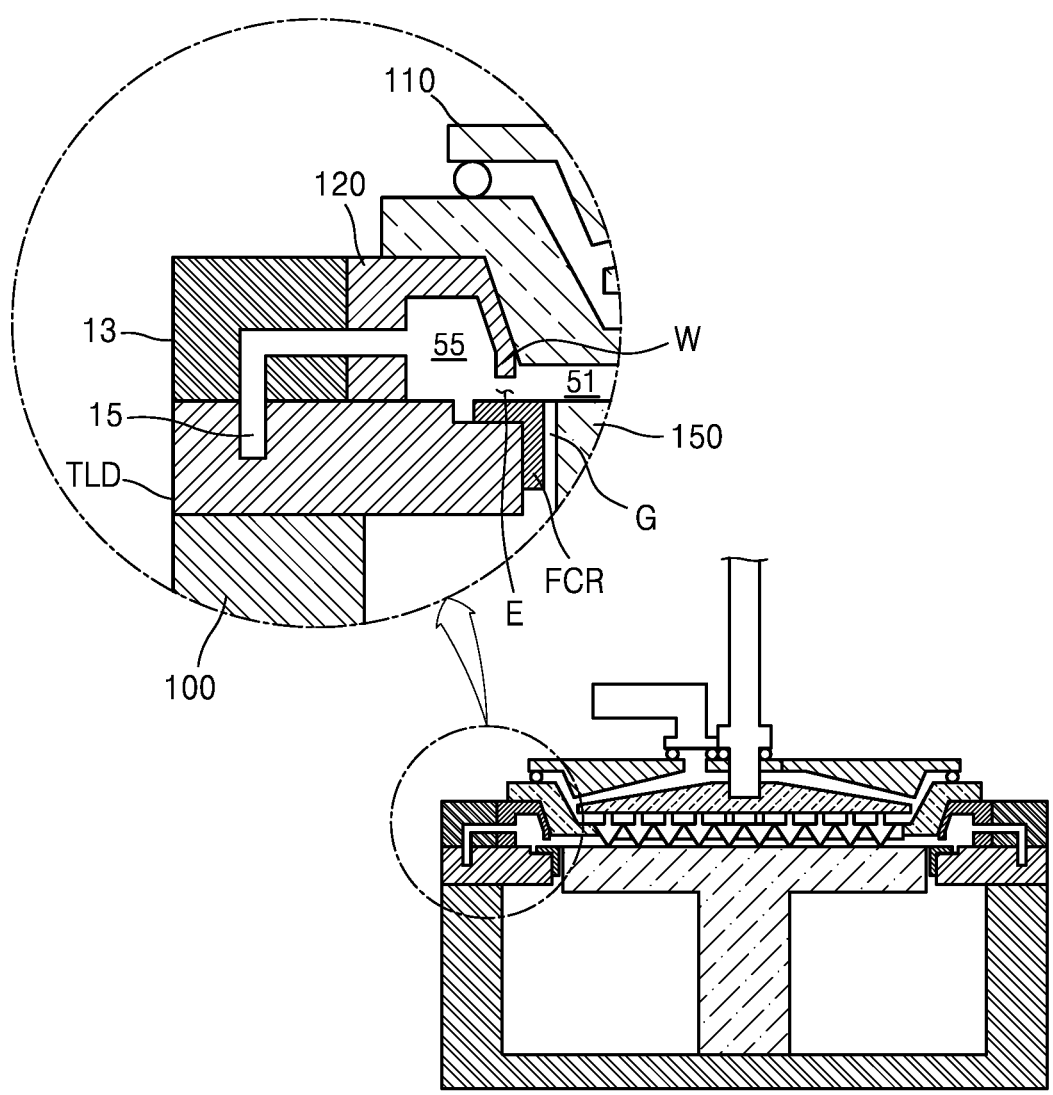
FIG. 4 is a cross-sectional view of the substrate processing device taken along a line IV-IV' of FIG. 3.
Figure 5:
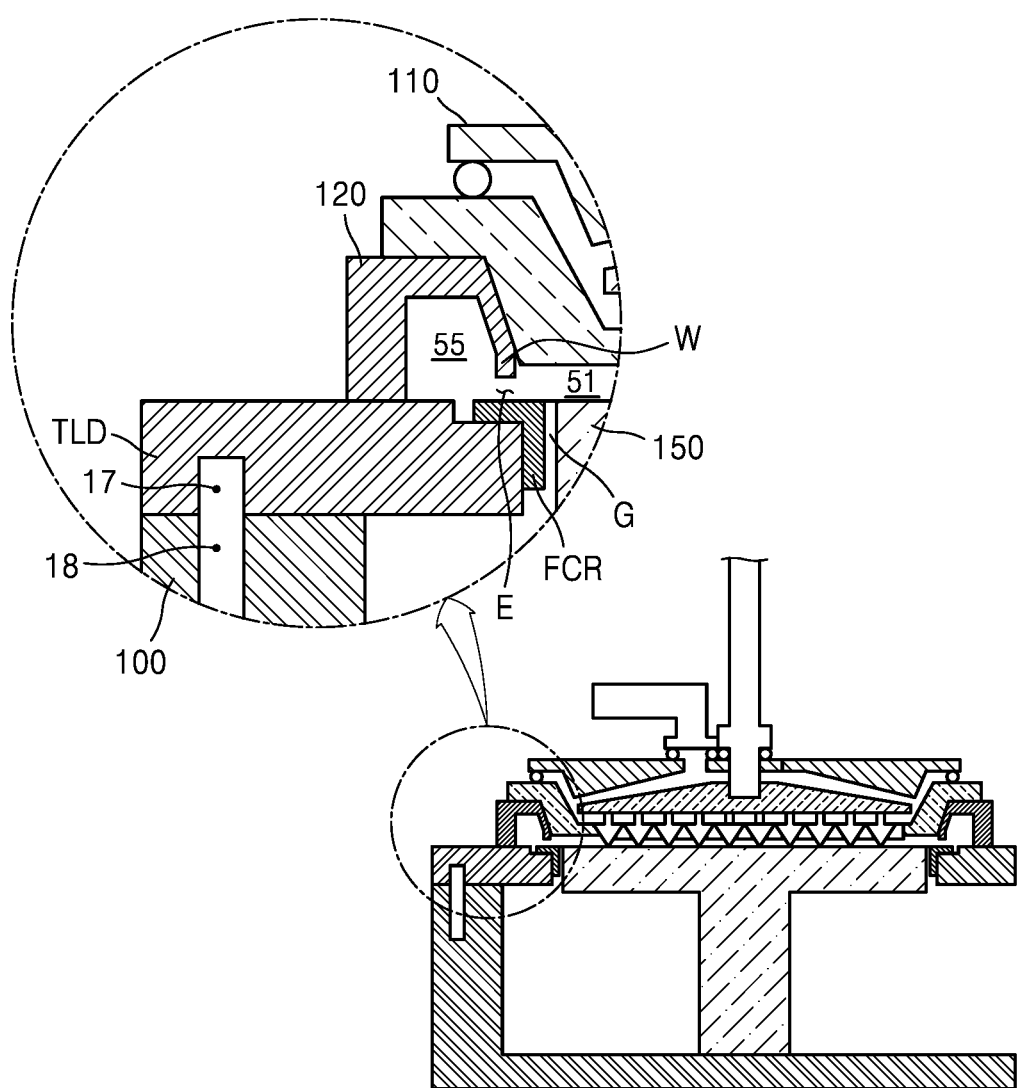
FIG. 5 is a cross-sectional view of the substrate processing device taken along a line V-V' of FIG. 3.
Figure 6:
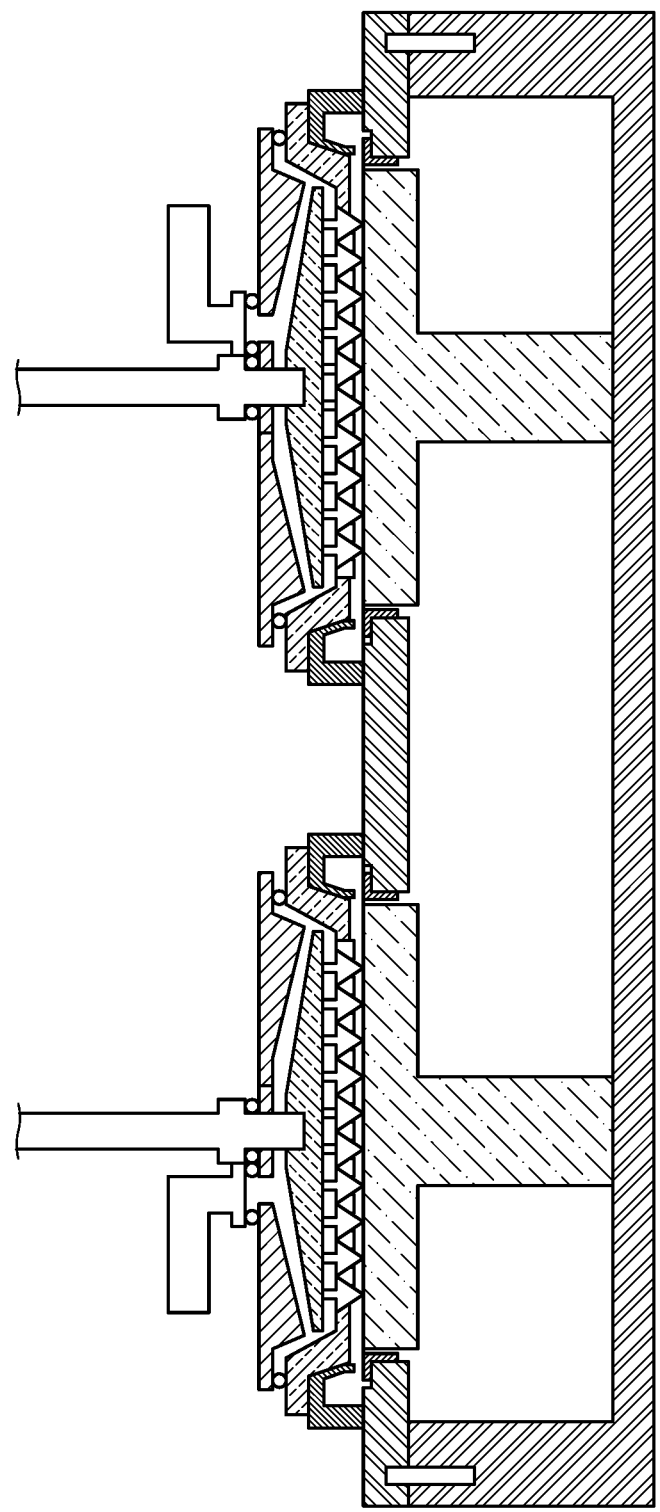
FIG. 6 is a cross-sectional view of the substrate processing device taken along a line VI-VI' of FIG. 3.

FIGS. 4 to 6 are cross-sectional views of the substrate processing device of FIGS. 2 and 3. FIG. 4 is a cross-sectional view of the substrate processing device taken along a line IV-IV' of FIG. 3, FIG. 5 is a cross-sectional view of the substrate processing device taken along a line V-V' of FIG. 3, and FIG. 6 is a cross-sectional view of the substrate processing device taken along a line VI-VI' of FIG. 3.

Referring to FIGS. 4 to 6, a reactor of the substrate processing device may include a substrate supporting unit 150, a first lid 110, and a second lid 120.

The first lid 110 is located on the substrate supporting unit 150 and covers the upper part of the reaction space 51, and may include a processing unit. The processing unit may be fastened (e.g., fixed) to the first lid 110 and members that perform appropriate functions depending on functions of the reactor may be employed. For example, when a reactor performs a deposition function, the processing unit of the first lid 110 may include a reactant supply (e.g., a showerhead assembly). In another embodiment, when the reactor performs a polishing function, the processing unit of the first lid 110 may include a polishing pad.

The second lid 120 may be between the first lid 110 and the partition 100. The second lid 120 may provide a space in which the processing unit connected to the first lid 110 is accommodated. Optionally, the second lid 120 may provide a portion of the space for an object to be processed. For example, when the partition 100 performs a deposition function, the reaction space 51 for deposition may be formed inside a side wall of the second lid 120, and the exhaust space 55 may be formed inside the second lid 120.

The support portion TLD may contact the second lid 120 to support the first lid 110 and the second lid 120. The support portion TLD may be supported by the partition 100. The support portion TLD may be disposed between the partition 100 and a lid (particularly, the second lid 120). A gap E may be formed between the second lid 120 and a flow control ring FCR. The gap E may serve as a channel between the first reaction space 51 and the first exhaust space 55. Therefore, the first reaction space 51 and the first exhaust space 55 may be in communication with each other through the channel.

Referring to FIG. 4, a portion of the second lid 120 may be in communication with the first exhaust port 13. Therefore, a portion of processing gas in the exhaust space 55 may be exhausted through the first exhaust port 13. In an example embodiment, the first exhaust port 13 may have an L-shaped or L-like shaped channel formed therein, so that gas in the exhaust space 55 flows in a side direction and is exhausted downward. Another portion of the second lid 120 may communicate with a second exhaust port in a different direction from the first exhaust port 13. Therefore, another portion of processing gas in the exhaust space 55 may be exhausted through the second exhaust port.

Gas exhausted downward through the first exhaust port 13 may be exhausted in connection with the first exhaust channel 15. As described above, the first exhaust channel 15 may extend to surround at least a portion of the first exhaust space 55. The first exhaust channel 15 may be connected to the first joining point 17. Similarly, gas exhausted downward through the second exhaust port may be exhausted in connection with a second exhaust channel. The second exhaust channel may extend to surround another portion of the first exhaust space 55, and the second exhaust channel may be connected to the first joining point 17.

The first joining point 17 may have a T-shaped or T-like shaped (e.g., Y-shaped) channel formed therein. Therefore, gas of the first exhaust channel 15 may be introduced in a first direction toward the first joining point 17 (e.g., a first side direction), and gas of the second exhaust channel 16 may be introduced in a second direction toward the first joining point 17 (e.g., a second side direction). Further, the gases introduced in the first direction and the second direction may be exhausted in a third direction (e.g., downward direction).

In an alternative embodiment, the flow control ring FCR may be disposed between the support portion TLD and the substrate supporting unit 150. The flow control ring FCR is arranged on the support portion TLD and may be arranged to be slidable on the support portion TLD. The flow control ring FCR may be spaced apart from the substrate supporting unit 150 to form a gap G and a pressure balance between the reaction space 51 and an inner space of the outer chamber may be controlled by adjusting the gap G.

FIGS. 7 to 9 are views of a substrate processing device according to embodiments of the inventive concept. In more detail, FIG. 7 shows a portion of the substrate processing device excluding a lid, an exhaust port, an exhaust path, and a transfer port (i.e., the transfer paths 18 and 28, the connection port CP, an external path EC connected to an external pump, etc.). FIG. 8 is a view of FIG. 7 viewed from a first direction, and FIG. 9 is a view of FIG. 7 viewed from a second direction. The substrate processing device according to these embodiments may be a modification of the substrate processing device according to the above-described embodiments. Hereinafter, repeated descriptions of the embodiments will not be given herein.

Referring to FIGS. 7 to 9, the transfer paths 18 (18a and 18b) and 28 (28a and 28b) are formed in the partition 100. The transfer paths 18 and 28 are connected to the external path EC through the connection port CP and the external path EC is connected to a main exhaust path 211. Therefore, gas in a reaction space is exhausted to the exhaust pump EP via transfer ports (the first joining point 17 and the second joining point 27), the transfer paths 18 and 28, the external path EC, and the main exhaust path 211.

As shown in FIG. 8, two reactors R1a and R1b in a first direction share the internal transfer path 18 (18a and 18b) and the remaining two reactors in a direction (not shown) opposite to the first direction share the other internal transfer path 28 (28a and 28b). The two internal transfer paths 18 and 28 are connected to an external path 9 through respective connection ports CP. FIG. 8 shows that the four reactors share the external path 9, the main exhaust path 211, and the exhaust pump EP. An isolation valve 210 may be added to the main exhaust path 211. Therefore, the exhaust pump EP may be protected from the outside atmosphere by the isolation valve 210 during a maintenance period. Further, a pressure control valve (e.g., a throttle valve) may be added to the main exhaust path 211. The external path EC may be fixed so as not to move in close contact with a lower surface of the partition 100 of the outer chamber. In an alternative embodiment, the two internal transfer paths 18 and 28 may be connected to each other within a bottom wall of the partition 100 of the outer chamber and directly connected to the main exhaust path 211, without the external path EC.

In a case of a substrate processing device to which side pumping is applied, typically, deviation of an exhaust flow occurs due to asymmetric exhaust characteristics of the side pumping. In more detail, in each reactor, the flow of reaction gas is concentrated to an exhaust port arranged in a side portion. Due to this concentration of the gas flow, a thin film near an exhaust port formed on a substrate is deposited thicker than a portion far away from an exhaust port in the opposite direction. Therefore, a profile of the thin film deposited on the substrate loses symmetry and its compatibility with a subsequent process is degraded.

FIGS. 10 to 13 are views of substrate processing devices according to embodiments of the inventive concept for solving the above-described problems. The substrate processing devices according to these embodiments may be modifications of the substrate processing device according to the above-described embodiments. Hereinafter, repeated descriptions of the embodiments will not be given herein.

Figure 10:
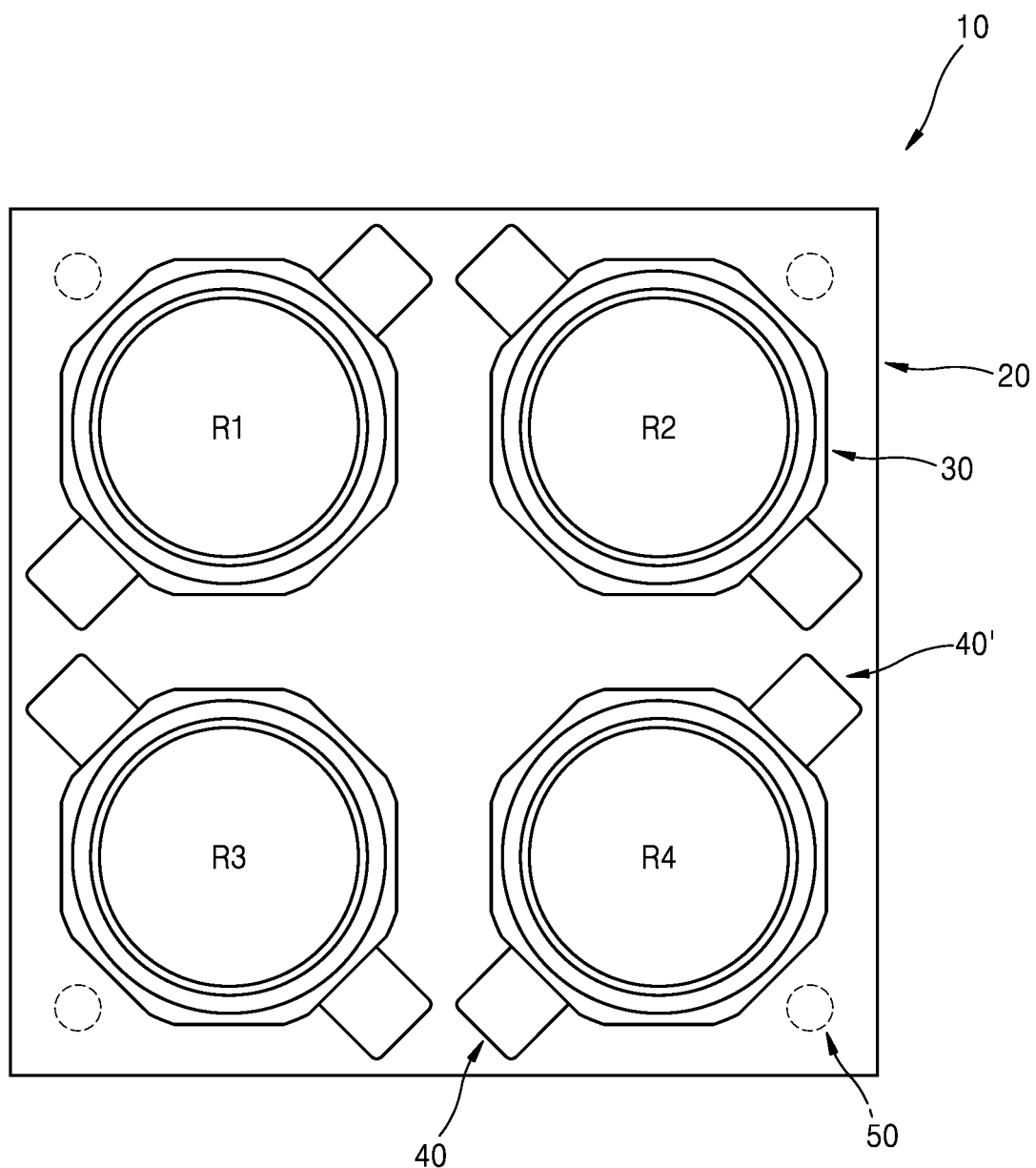
FIGS. 10 to 13 are views of substrate processing devices according to embodiments of the inventive concept.

FIG. 10 shows an upper support portion 20 of a chamber 10 including a plurality of reactors. The first reactor R1, the second reactor R2, the third reactor R3, and the fourth reactor R4 may be arranged at equal intervals on the support portion 20. Each reactor may include a gas supply portion (not shown), a heating block (not shown) arranged opposite the gas supply portion, and on which a processing substrate is seated, and an exhaust duct 30. In this case, the gas supply portion, the heating block, and the exhaust duct 30 may form a reaction space.

In FIG. 10, the gas supply portion and the heating block are omitted for the understanding of the disclosure. In each reactor of FIG. 10, at least two exhaust ports 40 and 40' are arranged on the side of the exhaust duct 30 and are arranged to face each other based on the center of symmetry of the exhaust duct 30, but are not limited thereto. A first joining point 50 is arranged on the support portion 20, is formed inside the support portion 20, and is arranged not to be directly connected to the exhaust ports 40 and 40'.

Figure 11:
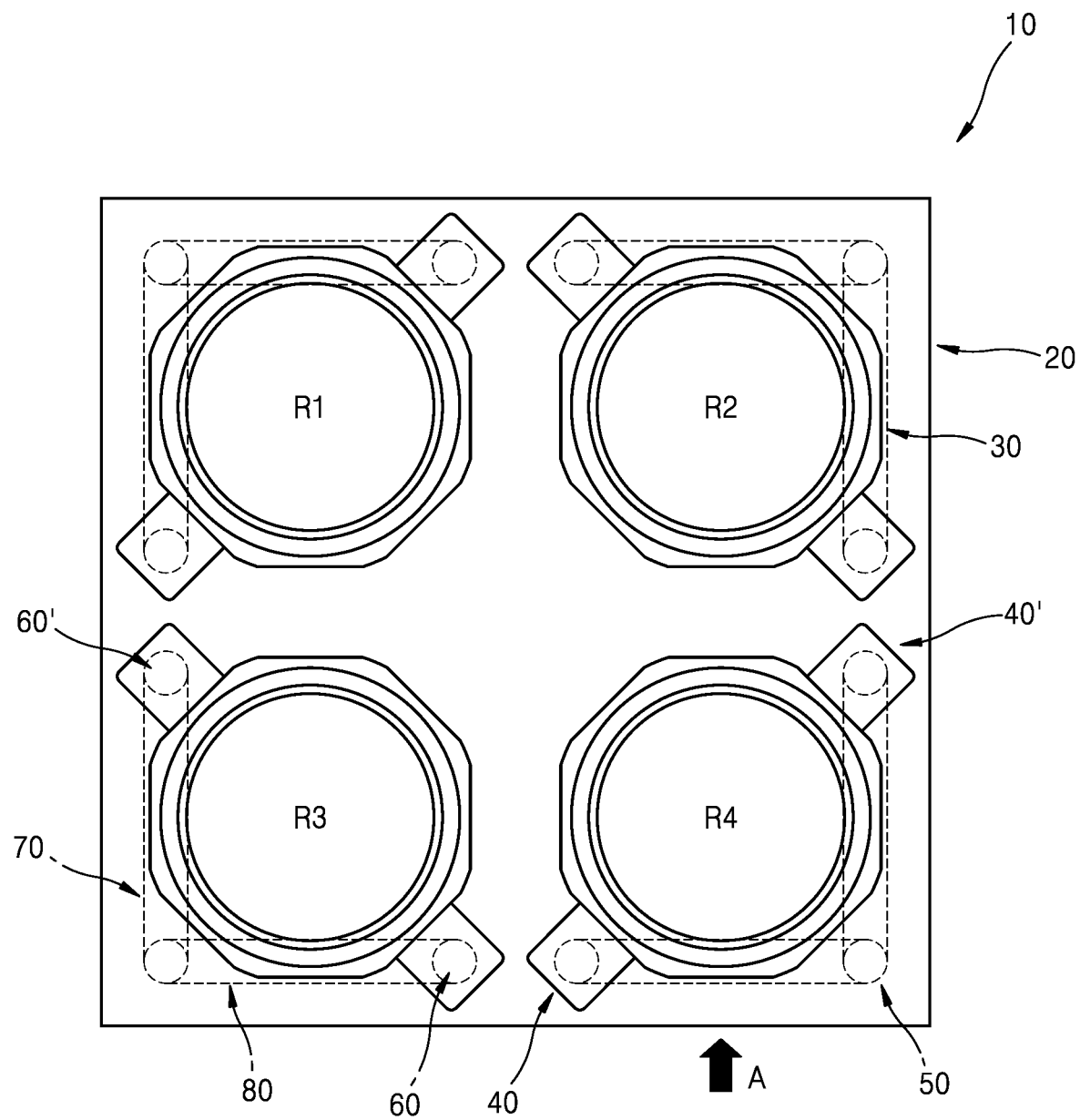

FIG. 11 is an internal perspective view of the support portion 20 of FIG. 10. Referring to FIG. 11, inside the support portion 20, a first exhaust channel 70 and a second exhaust channel 80 are formed around each reactor. The first exhaust channel 70, the second exhaust channel 80, and the exhaust duct 30 are connected to a reaction space through a first port path 60.

Figure 12:
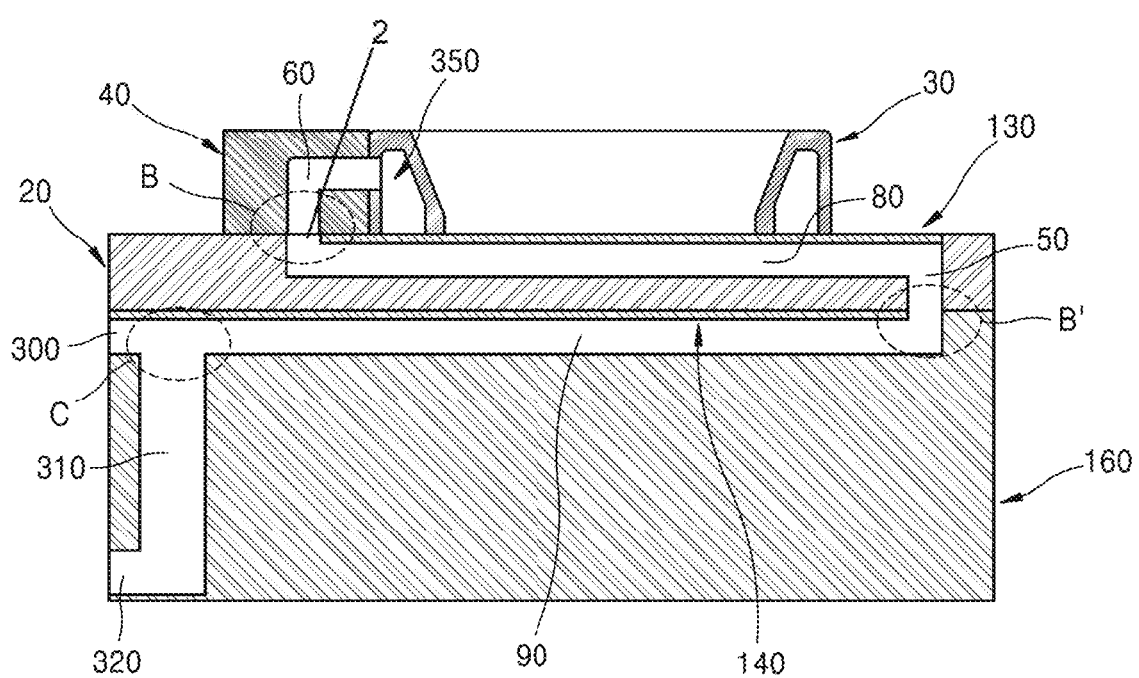

FIG. 12 is a perspective view of a side portion viewed from direction A in FIG. 11. FIG. 12 is for the fourth reactor R4, but the same applies to the first to third reactors R1, R2, and R3.

FIG. 12 shows a chamber exhaust system including the support portion 20 and a chamber wall 160. As shown in the FIGS. 11 and 12, it can be seen that an exhaust channel is formed in the support portion 20 and the chamber wall 160. In more detail, in FIG. 12, the second exhaust channel 80 is formed on the support portion 20, and at the first joining point 50, the second exhaust channel 80 is connected to the first exhaust channel 70. The second exhaust channel 80 communicates with an exhaust space 350 of the exhaust duct 30 through the first port path 60 of an exhaust port 40. A transfer channel 90 is formed inside the chamber wall 160, and the transfer channel 90 communicates with the first exhaust channel 70 and the second exhaust channel 80 through the first joining point 50.

The second exhaust channel 80 is formed on an upper surface of the support portion 20, and the upper surface is isolated from the outside by the first lid 130. The first lid 130 may be coupled to the support portion 20 by welding or the like, or may be integrally formed with a top lid. A sealing unit such as an O-ring may be inserted between the first lid 130 and the first port path 60 to prevent external gas from entering or gas in an exhaust path from flowing out.

The transfer channel 90 is formed on an upper surface of the chamber wall 160, and the upper surface is isolated from the outside by the second lid 140. The second lid 140 may be coupled to the chamber wall 160 by welding or the like, or may be integrally formed with the chamber wall 160. Alternatively, a sealing unit such as an O-ring may be inserted between the support portion 20 and the chamber wall 160 without the second lid 140. A sealing unit such as an O-ring is inserted into a portion B' between the second lid 140 and the first joining point 50 to prevent external gas from entering or gas in an exhaust path from flowing out. Accordingly, exhaust gas in a reaction space is exhausted to a main exhaust channel (not shown) and an exhaust pump (not shown) through the exhaust space 350, first port paths 60 and 60', the first and second exhaust channels 70 and 80, the first joining point 50, the transfer channel 90, a first exhaust path 310, and a second exhaust path 320.

FIG. 12 illustrates the fourth reactor R4, but the third reactor R3 (not shown) adjacent to the same side may also exhaust through the same process. A connection channel 300 communicates with the first exhaust path 310 at a connection point C of FIG. 12 and exhaust through the second exhaust path 320, the main exhaust channel, and the exhaust pump. That is, the third reactor R3 and the fourth reactor R4 have a structure in which the first exhaust path 310 and the second exhaust path 320 are shared in the chamber wall 160.

Although FIG. 12 shows the third reactor R3 and the fourth reactor R4, the same applies to the first reactor R1 and the second reactor R2. A path (e.g., the second exhaust path 320) through which gas exhausted from the third reactor R3 and the fourth reactor R4 is exhausted and a path (not shown) through which gas exhausted from the first reactor R1 and the second reactor R2 is exhausted are in communication with each other and are connected to a main exhaust channel (not shown) and an exhaust pump (not shown). For example, as shown in FIG. 13, the first reactor R1 and the second reactor R2 may exhaust to a main exhaust channel 170 and an exhaust pump through a third exhaust path 310' and a fourth exhaust path 320'.

Figure 13:
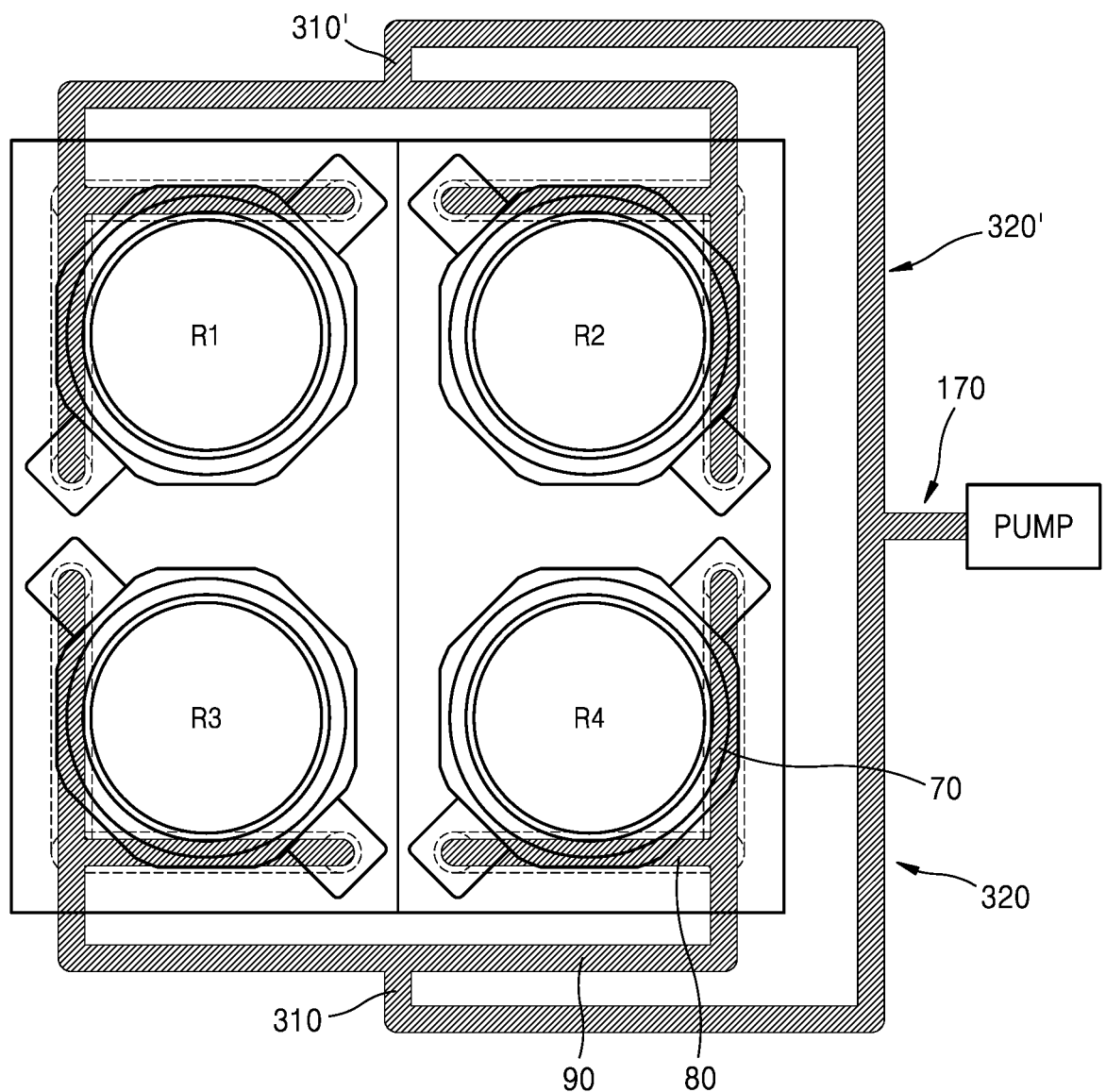

FIG. 13 schematically shows an exhaust structure of a chamber including the first reactor R1, the second reactor R2, the third reactor R3, and the fourth reactor R4.

In FIG. 13, the second exhaust path 320 and the fourth exhaust path 320' share the main exhaust channel 170 and the exhaust pump. The second exhaust path 320, the fourth exhaust path 320', and the main exhaust channel 170 may be formed inside a chamber wall or outside the chamber wall. For example, an external exhaust pipe may be arranged under the chamber wall. In addition, diameters or sizes of exhaust channels are different in order to maintain exhaust efficiency (exhaust conductance) constant. That is, diameters of the first exhaust channel 70 and the second exhaust channel 80 may be ½ of a diameter of the transfer channel 90, and the diameter of the transfer channel 90 may be ½ of a diameter of the first exhaust path 310. In addition, diameters of the first exhaust path 310 and the second exhaust path 320 may be ½ of a diameter of the main exhaust channel 170.

As described in FIGS. 10 to 13 above, a chamber system according to the disclosure has a simpler external structure, making it easier to install a chamber additive, such as a plasma generator or a matcher. In addition, because there is no need to install additional elements such as a plurality of external exhaust lines in an exhaust duct, for example, to improve the uniformity of exhaust, weight reduction of a device may be achieved. Because of the simplification and weight reduction of the device, maintenance becomes easier and operator safety may be further improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing device comprising:
   a reactor;
   a support portion configured to support at least a portion of the reactor;
   a first exhaust channel and a second exhaust channel in communication with a reaction space of the reactor;
   an exhaust space surrounding at least a portion of the reaction space;
   a first exhaust port between the exhaust space and the first exhaust channel; and
   a first sealing member between the first exhaust port and the support portion.

2. The substrate processing device of claim 1, wherein each of the first exhaust channel and the second exhaust channel extend to surround a portion of the reaction space.

3. The substrate processing device of claim 1, wherein the first exhaust channel extends through a first portion of the support portion.

4. The substrate processing device of claim 3, wherein the second exhaust channel extends through a second portion of the support portion different from the first portion.

5. The substrate processing device of claim 1, further comprising a first channel lid arranged between the first exhaust port and the support portion,
   wherein the first exhaust channel extends between the first channel lid and the support portion.

6. The substrate processing device of claim 5, further comprising a second sealing member between the first exhaust port and the first channel lid.

7. The substrate processing device of claim 6, wherein the support portion further comprises a joining point of the first exhaust channel and the second exhaust channel.

8. The substrate processing device of claim 7, wherein the joining point is arranged at a corner of the support portion.

9. The substrate processing device of claim 7, wherein the joining point comprises a T-shaped or T-like shaped channel structure.

10. The substrate processing device of claim 1, further comprising:
    a partition below the support portion; and
    a transfer channel in communication with the first exhaust channel and the second exhaust channel, wherein the transfer channel extends through a portion of the partition.

11. The substrate processing device of claim 10, further comprising a second channel lid arranged between the support portion and the partition.

12. The substrate processing device of claim 11, wherein the transfer channel extends between the second channel lid and the partition.

13. The substrate processing device of claim 10, wherein a diameter of the first exhaust channel is less than a diameter of the transfer channel.

14. The substrate processing device of claim 1, comprising a plurality of reactors including the reactor.

\* \* \* \* \*